United States Patent [19]

Tsutsumi

[11] Patent Number: 5,289,143
[45] Date of Patent: Feb. 22, 1994

[54] MAGNETOSTATIC WAVE DEVICE

[75] Inventor: Makoto Tsutsumi, Hirakata, Japan

[73] Assignee: Murata Manufacturing Co., Ltd., Kyoto, Japan

[21] Appl. No.: 918,503

[22] Filed: Jul. 22, 1992

[30] Foreign Application Priority Data

Jul. 29, 1991 [JP] Japan ................... 2-12965

[51] Int. Cl.$^5$ ............................................. H01P 1/20
[52] U.S. Cl. ............................................. 333/204
[58] Field of Search ............... 333/204, 156, 161, 238, 333/246

[56] References Cited

U.S. PATENT DOCUMENTS

| 3,656,179 | 4/1972 | De Loach | 333/156 |
| 3,671,888 | 6/1972 | Szente et al. | 333/204 |
| 3,891,949 | 6/1975 | Marquardt et al. | 333/238 |
| 3,895,435 | 7/1975 | Turner et al. | 333/238 |
| 4,028,643 | 6/1977 | Itoh | 333/219 |
| 4,677,404 | 6/1987 | Sequeria | 333/238 |
| 4,757,286 | 7/1988 | Konishi et al. | 333/235 |
| 4,967,171 | 10/1990 | Ban et al. | 333/204 |
| 5,032,805 | 7/1991 | Elmer et al. | 333/156 |

FOREIGN PATENT DOCUMENTS 4070109 3/1992 Japan .................. 333/219

Primary Examiner—Raymond A. Nelli
Attorney, Agent, or Firm—Jordan and Hamburg

[57] ABSTRACT

A magnetostatic wave device comprises two YIG thin films as a ferrimagnetic base material. At one side of the YIG thin films, a microstrip line is disposed so as to intersect orthogonally with the main surfaces of the YIG thin films. At the other side of the YIG thin films, a ground conductor is disposed so as to intersect orthogonally with the main surfaces of the YIG thin films. A d.c. magnetic field is applied in a direction which is parallel to the main surfaces of the YIG thin films and orthogonal to the main surface of the microstrip line.

9 Claims, 6 Drawing Sheets

F I G. 1
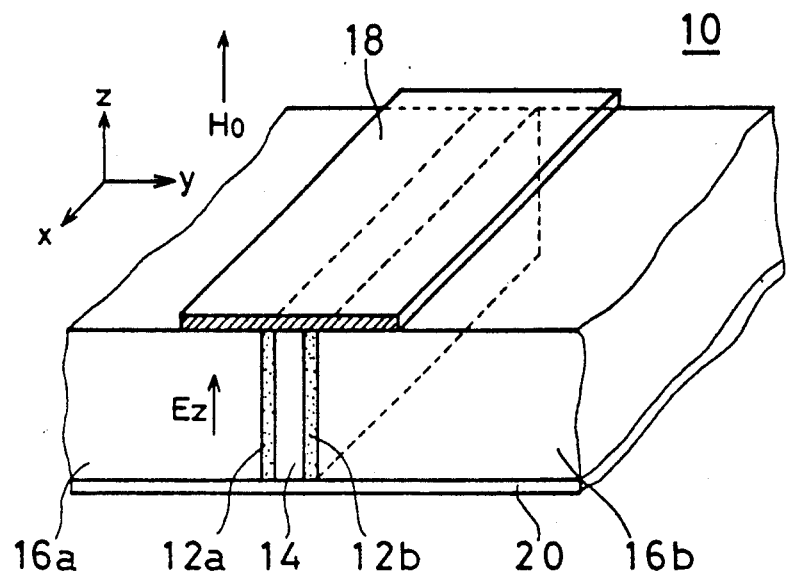
F I G. 2
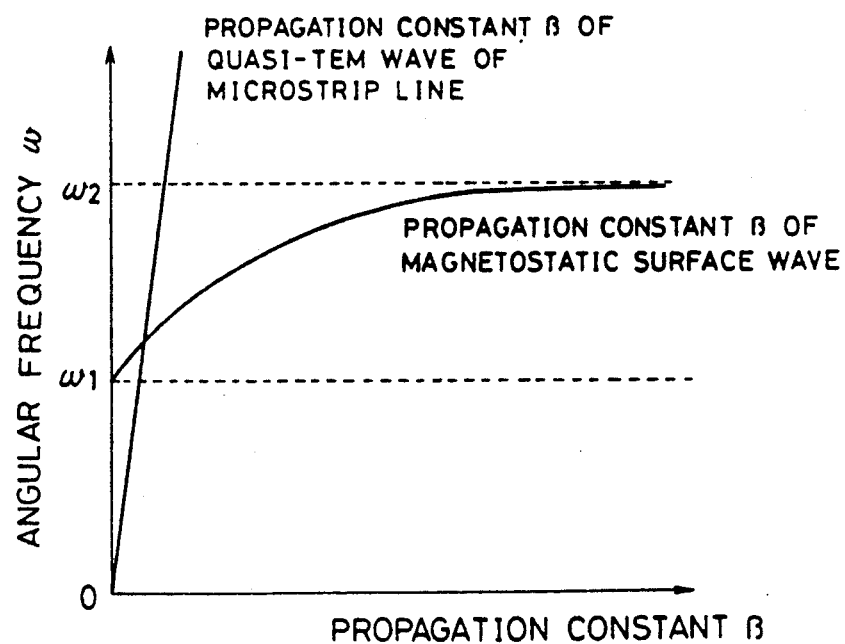

F I G. 4
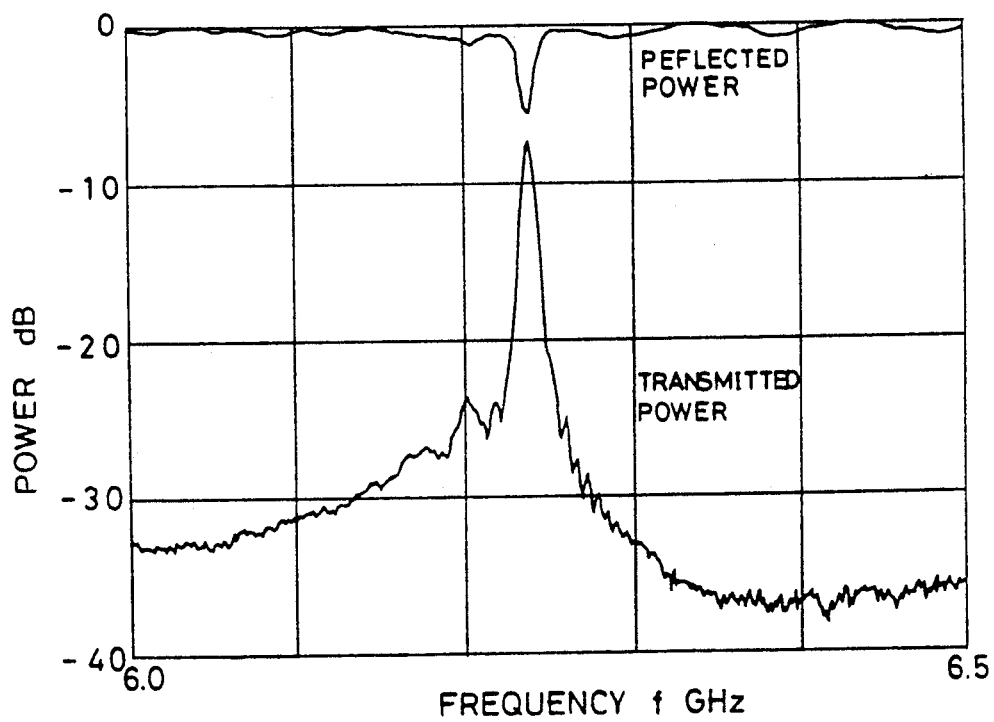

MAGNETOSTATIC WAVE DEVICE

BACKGROUND OF THE INVENTION

1. Field of the Invention

The present invention relates to a magnetostatic wave device, and particularly to a magnetostatic wave device which is used in a filter such as a band-pass filter and a band-stop filter, a delay line and the like.

2. Description of the Prior Art

FIG. 9 is a perspective view showing an example of the conventional magnetostatic wave device. The magnetostatic wave device 1 comprises a YIG (Yttrium, Iron, Garnet) thin film 2 as a ferrimagnetic base material. The YIG thin film 2 is formed on one main surface of a GGG (Gadolinium, Gallium, Garnet) substrate 3. On the YIG thin film 2, two fine wire conductors 4a and 4b as transducers are disposed in parallel with a space therebetween. Meanwhile, the other main surface of the GGG substrate 3 is bonded to one main surface of a ground conductor 5. One end of the wire conductor 4a and the other end of the other wire conductor 4b are respectively connected to the ground conductor 5.

FIG. 10 is a perspective view showing another example of the conventional magnetostatic wave device. In the magnetostatic wave device 1, a surface of a YIG thin film 2 on a GGG substrate 3 is bonded to one main surface of a dielectric substrate 6. On one main surface of the dielectric substrate 6, two microstrip lines 7a and 7b as transducers are formed in parallel with a space therebetween so as to cross the YIG thin film 2. On the other main surface of the dielectric substrate 6, a ground conductor 5 is formed. Meanwhile, one end of the microstrip line 7a is connected to the ground conductor 5 through one side of the dielectric substrate 6. The other end of the other microstrip line 7b is connected to the ground conductor 5 through the other side of the dielectric substrate 6.

In the magnetostatic wave devices 1 shown in FIG. 9 and FIG. 10, a d.c. magnetic field is applied to the YIG thin film 2, respectively. In these magnetostatic wave devices 1, for example, when a high-frequency signal is inputted to one transducer, a high-frequency magnetic field is generated around the transducer by the high-frequency electric current flowing in the transducer, and a predetermined magnetostatic wave is excited in the YIG thin film 2, respectively. The magnetostatic wave is propagated from one transducer to the other transducer. When the d.c. magnetic field is applied to the YIG thin film 2 in a direction orthogonal to the main surface of the YIG thin film 2, a magnetostatic forward volume wave (MSFVW) is excited. When the d.c. magnetic field is applied in a direction which is parallel to the YIG thin film 2 and perpendicular to the direction of propagation of the magnetostatic wave, a magnetostatic surface wave (MSSW) is excited. When the d.c. magnetic field is applied in a direction which is parallel to the YIG thin film 2 and to the direction of propagation of the magnetostatic wave, a magnetostatic backward volume wave (MSBVW) is excited.

The magnetostatic wave is received by the other transducer and is outputted therefrom as a predetermined high-frequency signal. The magnetostatic wave device 1 is used, for example, in a band-pass filter, a band-stop filter and a delay line.

In the magnetostatic wave devices 1 shown in FIG. 9 and FIG. 10, though a sharp resonance characteristics is obtained, a band width is wide.

SUMMARY OF THE INVENTION

Therefore, a principal object of the present invention is to provide a magnetostatic wave device having a narrow band width and a sharp resonance characteristics.

The present invention is directed to a magnetostatic wave device comprising a ferrimagnetic base material, a microstrip line disposed at one side of the ferrimagnetic base material so as to intersect orthogonally with a main surface of the ferrimagnetic base material, and a ground conductor disposed at the other side of the ferrimagnetic base material so as to intersect orthogonally with the main surface of the ferrimagnetic base material, wherein a d.c. magnetic field is applied in a direction which is parallel to the main surface of the ferrimagnetic base material and orthogonal to the main surface of the microstrip line.

When a high frequency signal is inputted to the microstrip line, a quasi-TEM wave is propagated to the microstrip line. By an electric field component of the quasi-TEM wave in a direction parallel to the main surface of the ferrimagnetic base material, a magnetostatic surface wave is excited directly on the ferrimagnetic base material.

A propagation constant of the magnetostatic surface wave increases rapidly as the frequency increases between certain two frequencies (angular frequencies). Meanwhile, the propagation constant of the quasi-TEM wave of the microstrip line changes in proportion to the frequency. At the frequency where the propagation constant of the magnetostatic surface wave is coincided with or closed to that of the quasi-TEM wave, the magnetostatic surface wave is excited effectively. On the contrary, at the frequency where the propagation constant of the magnetostatic surface wave is apart from that of the quasi-TEM wave, the quasi-TEM wave suffers a loss. As a result, a sharp resonance characteristics with a narrow band width is obtained.

According to the present invention, a magnetostatic wave device having a sharp resonance characteristics with a narrow band width and used, for example, in a band-pass filter, a band-stop filter and the like is obtained.

The above and other objects, features, aspects and advantages of the present invention will become more apparent from the following detailed description of the embodiments with reference to the accompanying drawings.

BRIEF DESCRIPTION OF THE DRAWINGS

FIG. 1 is a perspective view of an essential portion showing an example of the magnetostatic wave device for explaining the principle of the present invention.

FIG. 2 is a graph showing the propagation constant vs. angular frequency characteristics of the magnetostatic wave device shown in FIG. 1.

FIG. 4 is a graph showing the frequency characteristics of the magnetostatic wave device shown in FIG. 3.

DESCRIPTION OF THE PREFERRED EMBODIMENTS

Figure 3:
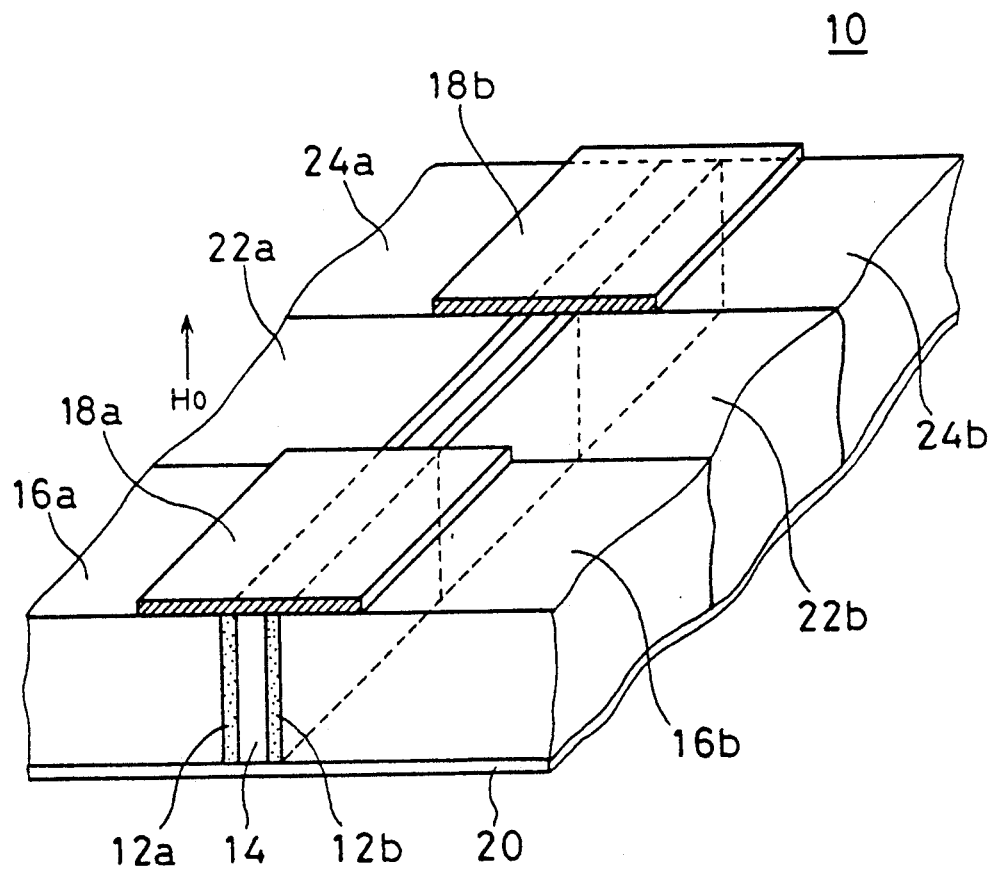
FIG. 3 is a perspective view of an essential portion showing one embodiment of the present invention.

FIG. 1 is a perspective view of an essential portion showing an example of the magnetostatic wave device for explaining the principle of the present invention. The magnetostatic wave device 10 comprises, for example, two YIG thin films 12a and 12b as a ferrimagnetic base material. The YIG thin films 12a and 12b are formed by, for example, liquid phase epitaxy (LPE) of YIG on both main surfaces of a GGG substrate 14.

Meanwhile, two dielectric substrates 16a and 16b consisting of, for example, a material having a high dielectric constant are disposed so as to clamp the YIG thin films 12a and 12b. In this case, two dielectric substrates 16a and 16b are disposed so as to clamp the YIG thin films 12a and 12b by their sides. The dielectric substrates 16a and 16b are intended to increase the exciting efficiency of the magnetostatic wave.

On one side of the YIG thin films and the GGG substrate, a microstrip line 18 of, for example, a strip is formed throughout one main surfaces of the dielectric substrates. Thus, the microstrip line 18 is disposed to intersect orthogonally with the main surfaces of the YIG thin films 12a and 12b at one side of the YIG thin films 12a and 12b.

Furthermore, a ground conductor 20 is formed on the other side of the YIG thin films and the GGG substrate, and throughout the other main surfaces of the dielectric substrates. Thus, the ground conductor 20 is disposed to intersect orthogonally with the main surfaces of the YIG thin films 12a and 12b at the other side of the YIG thin films 12a and 12b.

To the magnetostatic wave device 10, a d.c. magnetic field $H_0$ is applied in a direction (a direction z shown in FIG. 1), which is parallel to the main surfaces of the YIG thin films 12a and 12b and orthogonal to the main surface of the microstrip line 18.

Figure 9:
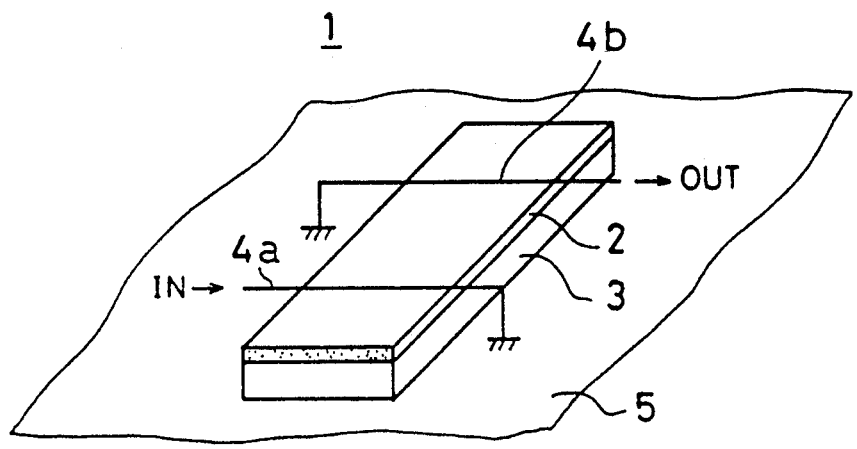
FIG. 9 is a perspective view showing an example of the conventional magnetostatic wave device.
Figure 10:
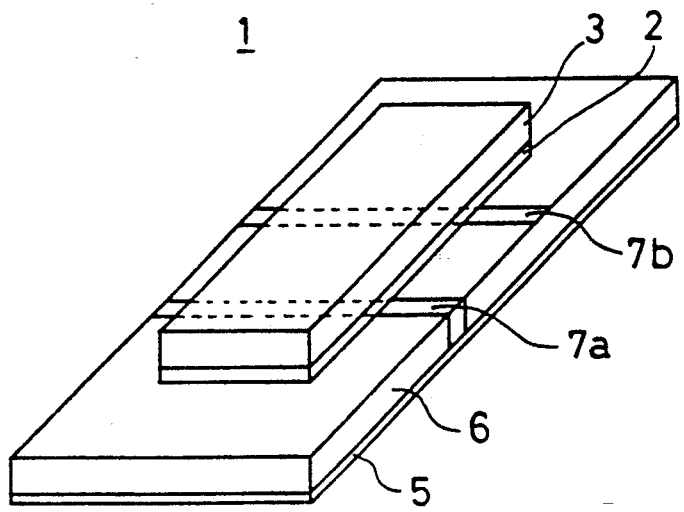
FIG. 10 is a perspective view showing another example of the conventional magnetostatic wave device.

In the magnetostatic wave device 10, when a high frequency signal is inputted to one end in the longitudinal direction of the microstrip line 18, a quasi-TEM wave to be described later is excited on the microstrip line 18, and by an electric field component $E_z$ of the quasi-TEM wave in the direction z, a magnetostatic surface wave is excited directly on the YIG thin films 12a and 12b. That is, in order to excite the magnetostatic wave in the conventional magnetostatic wave devices shown in FIG. 9 and FIG. 10, by a high-frequency electric current flowing in one transducer, a high-frequency magnetic field is generated around the transducer to excite a high-frequency magnetic flux, which is coupled to the magnetostatic wave. On the contrary, in the magnetostatic wave device 10, the electric field component $E_z$ of the quasi-TEM wave in the direction z is coupled directly to the high frequency magnetic flux. According to a simple analysis, the relation $E_z = (\omega/\beta)b_y$ is established when the angular frequency is $\omega$, the propagation constant of the magnetostatic surface wave is $\beta$ and the high-frequency magnetic flux in the lateral direction of the microstrip line 18 or the direction y shown in FIG. 1 is $b_y$.

That is, in the magnetostatic wave device 10, the magnetostatic surface wave is excited by the electric field component of the quasi-TEM wave in the direction z.

Now, the quasi-TEM wave is described. A basic mode of the microstrip line is a TEM mode. And hence, in case of the low frequency, an electric field and a magnetic field are all present within a plane perpendicular to the main surface of the microstrip line. However, when the frequency becomes higher, a surface wave is excited on the dielectric substrate and is coupled thereto, so that it turns into a hybrid mode having the electric field component and the magnetic field component in the wave proceeding direction. However, since this coupling is usually small, the mode of the microstrip line is substantially the TEM mode. Accordingly, it is called the quasi-TEM wave.

In the magnetostatic wave device 10, as shown in FIG. 2, in the angular frequency $\omega$ which is between two angular frequencies $\omega_1$ and $\omega_2$ represented in the following equations (1) and (2), the propagation constant $\beta$ of the magnetostatic surface wave changes rapidly from 0 to $\infty$ as the angular frequency increases from the angular frequency $\omega_1$ to the angular frequency $\omega_2$.

$$\omega_1 = \gamma \{Hi(Hi + 4\pi M)\}^{\frac{1}{2}} \ldots \quad (1)$$

$$\omega_2 = \gamma \{Hi + (4\pi M/2)\} \ldots \quad (2)$$

In the abovementioned equations (1) and (2), $\gamma$ represents a gyro-magnetic ratio, Hi represents an internal magnetic field in the YIG thin film and $4\pi M$ represents a saturated magnetization in the YIG thin film.

Meanwhile, the propagation constant of the quasi-TEM wave of the microstrip line 18 changes in proportion to the angular frequency $\omega$ as shown in FIG. 2.

The magnetostatic surface wave is excited effectively at the frequency where the propagation constant of the magnetostatic surface wave is coincided with or closed to that of the quasi-TEM wave of the microstrip line. On the contrary, at the frequency where the propagation constant of the magnetostatic surface wave becomes larger and is apart from that of the quasi-TEM wave of the microstrip line, the magnetostatic surface wave is not excited effectively but gives loss to the TEM wave. By this basic operation, a narrow band width and sharp resonance characteristics is obtained.

FIG. 3 is a perspective view of an essential portion showing one embodiment of the present invention. In the embodiment, on both main surfaces of the GGG substrate 14 of 2 mm × 10 mm × 400 μm, the YIG thin films 12a and 12b having the thickness of 13.5 μm are formed. A magnetic loss in the YIG thin films is 1 ($O_e$).

One end portion of, for example, 3.5 mm inside from one end in the longitudinal direction of the YIG thin films 12a and 12b, is clamped by sides of two dielectric substrates 16a and 16b consisting of a high dielectric material having a relative permittivity of, for example, 38. The dielectric substrates 16a and 16b are intended to increase the exciting efficiency of the magnetostatic wave. On one side of the YIG thin films and the GGG substrate at the one end portion, a microstrip line 18a having the width of, for example, 1.5 mm is formed throughout one main surfaces of the dielectric substrates 16a and 16b.

An intermediate portion of, for example, 3 mm at the middle in the longitudinal direction of the YIG thin films 12a and 12b, is clamped by sides of two dielectric substrates 22a and 22b consisting of a low dielectric material. The dielectric substrates 22a and 22b are intended to stop the propagation of the quasi-TEM wave.

Furthermore, the other end portion of, for example, 3.5 mm inside from the other end in the longitudinal direction of the YIG thin films 12a and 12b, is clamped by two dielectric substrates 24a and 24b consisting of a high dielectric material having a relative permittivity of, for example, 38. The dielectric substrates 24a and 24b are also intended to increase the exciting efficiency of the magnetostatic wave. On one side of the YIG thin films and the GGG substrate at the other end portion, a microstrip line 18b having the width of, for example, 1.5 mm is formed throughout one main surfaces of the dielectric substrates 24a and 24b. Thus, a gap between the microstrip lines 18a and 18b is 3 mm.

Meanwhile, on the other side of the YIG thin films and the GGG substrate and throughout the other main surfaces of the dielectric substrates 16a, 16b, 22a, 22b, 24a and 24b, a ground conductor 20 is formed.

Also to the magnetostatic wave device 10, a d.c. magnetic field $H_0$ of, for example, 1762 ($O_e$) is applied in a direction, which is parallel to the main surfaces of the YIG thin films 12a and 12b and orthogonal to the main surfaces of the microstrip lines 18a and 18b.

In the magnetostatic wave device 10, when a high-frequency signal is inputted to one microstrip line 18a, the quasi-TEM wave is excited on the microstrip line 18a. Also, by the magnetic field component of the quasi-TEM wave in the direction parallel to the main surfaces of the YIG thin films, the magnetostatic surface wave is excited on the YIG thin films 12a and 12b. In this case, in the vicinity of cut-off frequency region of the magnetostatic surface wave having the propagation constant coincided with or closed to that of the quasi-TEM wave, the magnetostatic surface wave is excited effectively. The magnetostatic surface wave is received by the other microstrip line 18b and is outputted therefrom as a predetermined high-frequency signal.

In between the microstrip lines 18a and 18b, the quasi-TEM wave is stopped.

Thus, in the magnetostatic wave device 10, the outputted high-frequency signal is limited within a band of small propagation constant of the magnetostatic surface wave received by the microstrip line 18b, and as shown its measured frequency characteristics in FIG. 4, a narrow band width and sharp band-pass filter characteristics is obtained spontaneously. Meanwhile, in the cut-off frequency region of the magnetostatic surface wave, there is little effect of loss by the YIG thin films 12a and 12b, and a good band-pass filter characteristics with small ripple is obtained.

Figure 5:
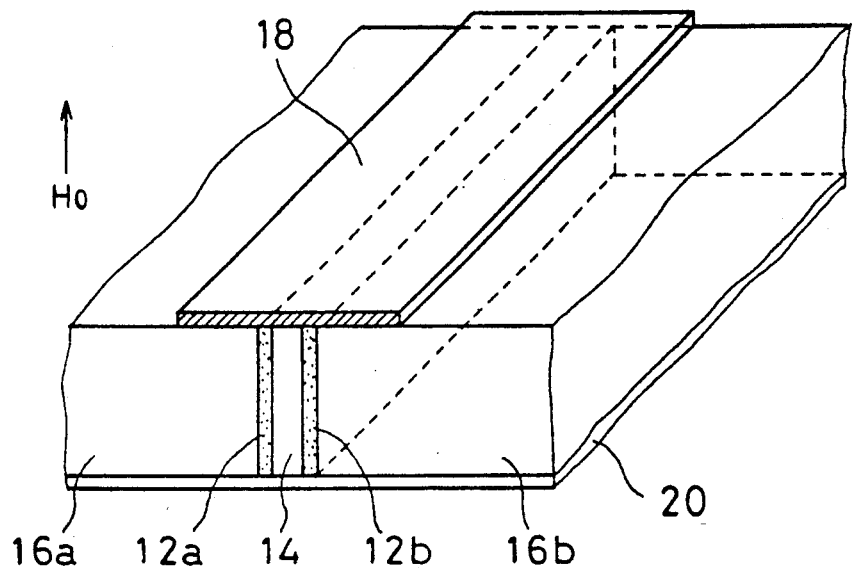
FIG. 5 is a perspective view of an essential portion showing another embodiment of the present invention.

FIG. 5 is a perspective view of an essential portion showing another embodiment of the present invention. The magnetostatic wave device 10 of the embodiment has a same structure as the magnetostatic wave device shown in FIG. 1 for explaining the principle of the present invention. However, the size and thickness of the YIG thin films 12a and 12b and the GGG substrate 14 are as same as that of the embodiment of FIG. 3, the relative permittivity of the dielectric substrates 16a and 16b is 38 and the width of the microstrip line 18 is 1 mm. Intensity of the applied d.c. magnetic field is 1762 ($O_e$).

Figure 6:
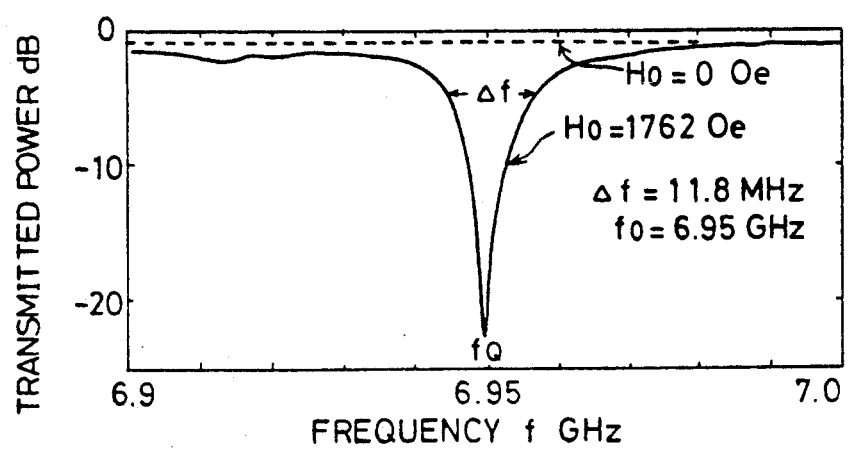
FIG. 6 is a graph showing the frequency characteristics of the magnetostatic wave device shown in FIG. 5.

In the embodiment shown in FIG. 5, to one end in the longitudinal direction of the microstrip line 18, a high-frequency signal is inputted. Whereupon, most of the signal passes through the microstrip line 18 in the form of quasi-TEM wave, and is outputted from the other end of the microstrip line 18. However, in a ferrimagnetic resonance frequency wherein the propagation constant of the magnetostatic surface wave is very large, a magnetostatic surface wave loss is at a maximum and a sharp notch characteristic is given to the quasi-TEM wave at the frequency. The magnetostatic wave device 10, as shown its frequency characteristics in FIG. 6, has a band-stop filter characteristics in which a band width of −3 dB is 11.8 MHz which is very narrow and sharp resonance, and an insertion loss is small as 1.6 dB.

Though the embodiments shown in FIG. 3 and FIG. 5 respectively comprise two YIG thin films as the ferrimagnetic base material, they may be constructed to have one YIG thin film, removing one of the YIG thin films by means of, for example, etching.

Figure 7:
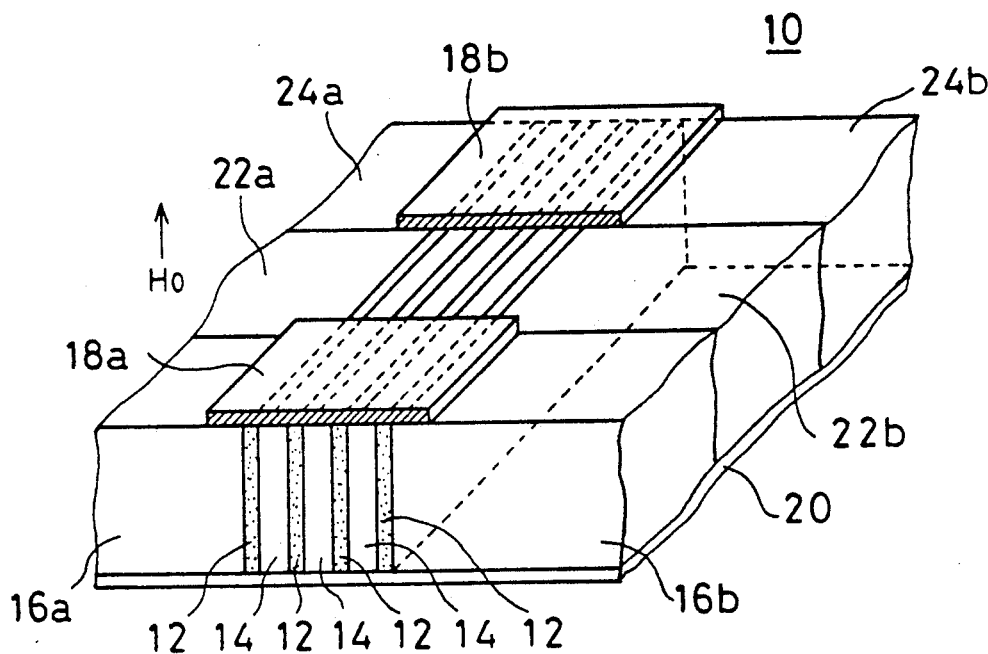
FIG. 7 is a perspective view of an essential portion showing a modified example of the embodiment shown in FIG. 3.
Figure 8:
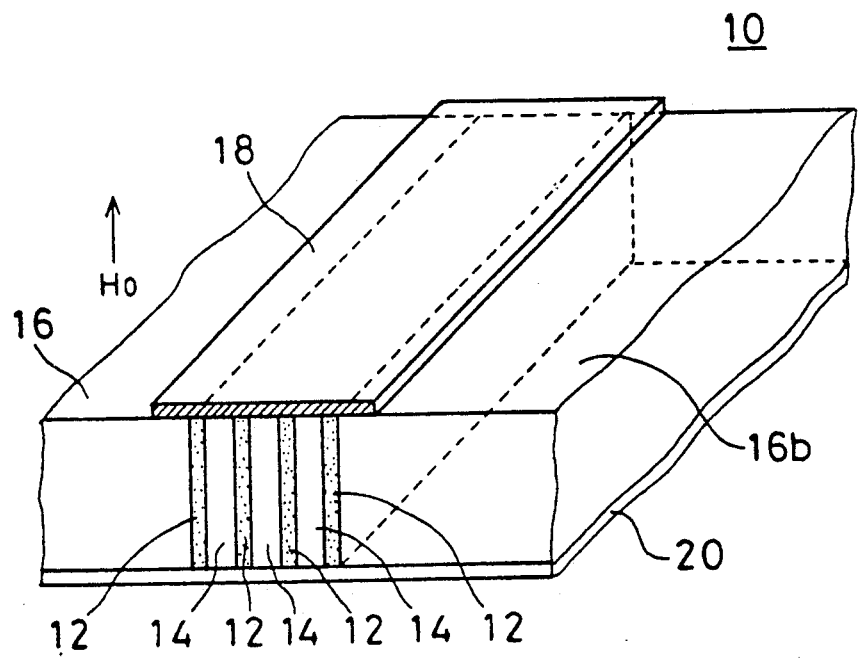
FIG. 8 is a perspective view of an essential portion showing a modified example of the embodiment shown in FIG. 5.

In the embodiments shown in FIG. 3 and FIG. 5, they may be constructed to have three or more YIG thin films 12 as shown in FIG. 7 and FIG. 8, respectively. Even when the number of YIG thin films is increased as such, since the magnetostatic surface wave is excited on the YIG thin films by the magnetic field component of the quasi-TEM wave of the microstrip line, the magnetostatic surface wave can be excited uniformly on the YIG thin films. When the number of YIG thin films is increased as such, an insertion loss, a dynamic range and power resistance characteristics are improved. In the magnetostatic wave device 10 shown in FIG. 7, a band-pass filter characteristics with a narrow band width is obtained, and in the magnetostatic wave device 10 shown in FIG. 8, a band-stop filter characteristic with a narrow band width is obtained.

It will be apparent from the foregoing that, while the present invention has been described in detail and illustrated, these are only particular illustrations and examples, and the invention is not limited to these. The spirit and scope of the invention is limited only by the appended claims.

What is claimed is:

1. A magnetostatic wave device comprising:
   a ferrimagnetic base material;
   a microstrip line disposed at one side of said ferrimagnetic base material so as to intersect orthogonally with a main surface of said ferrimagnetic base material; and
   a ground conductor disposed at the other side of said ferrimagnetic base material so as to intersect orthogonally with the main surface of said ferrimagnetic base material; wherein
   a d.c. magnetic field is applied in a direction which is parallel to the main surface of said ferrimagnetic base material and orthogonal to the main surface of said microstrip line.

2. A magnetostatic wave device according to claim 1, wherein said ferrimagnetic base material includes a YIG thin film.

3. A magnetostatic wave device according to claim 2, which further comprises a GGG substrate for supporting said YIG thin film.

4. A magnetostatic wave device according to claim 3, wherein said GGG substrate is formed between a plurality of said YIG thin films.

5. A magnetostatic wave device according to claim 1, which further comprises dielectric substrates clamp said ferrimagnetic base material.

6. A magnetostatic wave device according to claim 5, wherein said microstrip line is formed on one side of said ferrimagnetic base material and on one main surfaces of said dielectric substrates, further said ground conductor is formed on the other side of said ferrimagnetic base material and on the other main surfaces of said dielectric substrates.

7. A magnetostatic wave device according to claim 6, wherein said ferrimagnetic base material includes a YIG thin film.

8. A magnetostatic wave device according to claim 7, which further comprises a GGG substrate for supporting said YIG thin film.

9. A magnetostatic wave device according to claim 8, wherein said GGG substrate is formed between a plurality of said YIG thin films.

* * * * *